(12) United States Patent
Liu et al.

(10) Patent No.: US 11,085,756 B2
(45) Date of Patent: Aug. 10, 2021

(54) HUMAN BODY DISTANCE DETECTION MODULE FOR ELECTRONIC DEVICE, ELECTRONIC DEVICE AND CONTROL METHOD THEREOF

(71) Applicant: Beijing Xiaomi Mobile Software Co., Ltd., Beijing (CN)

(72) Inventors: Yaqi Liu, Beijing (CN); Linchuan Wang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/810,567

(22) Filed: Mar. 5, 2020

(65) Prior Publication Data
US 2021/0116234 A1    Apr. 22, 2021

(30) Foreign Application Priority Data

Oct. 16, 2019  (CN) .......................... 201910984304.9

(51) Int. Cl.
*G01B 11/14* (2006.01)
*G06F 3/01* (2006.01)
*H04M 1/02* (2006.01)

(52) U.S. Cl.
CPC .............. *G01B 11/14* (2013.01); *G06F 3/011* (2013.01); *H04M 1/026* (2013.01); *H04M 1/0249* (2013.01)

(58) Field of Classification Search
CPC ...... G01B 11/14; G06F 3/011; H04M 1/0249; H04M 1/026
See application file for complete search history.

(56) References Cited

U.S. PATENT DOCUMENTS

2013/0241780 A1   9/2013  Amm et al.
2014/0183530 A1*  7/2014  Yamazaki ......... H01L 29/78696
                                                    257/43
(Continued)

FOREIGN PATENT DOCUMENTS

CN    203838665 U    9/2014
CN    106229614 A    12/2016
(Continued)

OTHER PUBLICATIONS

Extended European Search Report of counterpart EP Application No. 20163855.8 dated Sep. 28, 2020.
(Continued)

*Primary Examiner* — David Bilodeau
(74) *Attorney, Agent, or Firm* — Finnegan, Henderson, Farabow, Garrett & Dunner, L.L.P.

(57) ABSTRACT

A human body distance detection module for an electronic device, includes: a first metal sheet; a capacitance sensor electrically connected to the first metal sheet and configured to obtain a capacitance to ground of the first metal sheet, the capacitance to ground configured to reflect a distance between a human body and the electronic device; and a second metal sheet, at least one part of the second metal sheet being disposed opposite to the first metal sheet, the second metal sheet and the first metal sheet being insulated from each other to enable mutual coupling, and at least one part of the second metal sheet being not parallel to the first metal sheet.

19 Claims, 6 Drawing Sheets

(56) References Cited

U.S. PATENT DOCUMENTS

| | | |
|---|---|---|
| 2015/0077298 A1* | 3/2015 | Chen ................... H01Q 9/14 |
| | | 343/749 |
| 2015/0200444 A1 | 7/2015 | Mercer et al. |
| 2015/0200447 A1 | 7/2015 | Tang et al. |
| 2018/0316348 A1 | 11/2018 | Nakatani et al. |
| 2020/0267847 A1* | 8/2020 | Lee ................... H05K 5/0017 |

FOREIGN PATENT DOCUMENTS

| | | |
|---|---|---|
| CN | 109373887 A | 2/2019 |
| JP | 2009222423 A | 10/2009 |
| KR | 101046666 B1 | 7/2011 |
| KR | 20150099430 A | 8/2015 |
| KR | 20160022265 A | 2/2016 |
| WO | WO 2015/068244 A1 | 5/2015 |

OTHER PUBLICATIONS

International Search Report and Written Opinion of PCT Application No. PCT/CN2019/130254 dated Jul. 21, 2020.
Notification of Reason for Refusal of counterpart Korean Application No. 10-2020-7007886 dated Mar. 23, 2021.

* cited by examiner

HUMAN BODY DISTANCE DETECTION MODULE FOR ELECTRONIC DEVICE, ELECTRONIC DEVICE AND CONTROL METHOD THEREOF

CROSS-REFERENCE TO RELATED APPLICATIONS

This application is based on and claims priority to Chinese Application No. 201910984304.9 filed on Oct. 16, 2019, the content of which is incorporated by reference in its entirety.

TECHNICAL FIELD

The present disclosure relates to the field of wireless communication technology, and more particularly to a human body distance detection module for an electronic device, an electronic device and a control method thereof.

BACKGROUND

Electronic devices include mobile phones, tablet computers, and the like, which usually have a wireless communication function and are convenient to use.

An antenna is an essential structure for implementing wireless communication, and the antenna can radiate electromagnetic waves with a certain power when working. The electromagnetic waves radiated by the antenna must reach a certain intensity to ensure normal wireless communication, while the electromagnetic waves with large intensity may do harm to the human body. In order to ensure that an electronic device can perform wireless communication normally without harm to the human body, a human body distance detection module is usually provided in the electronic device. The human body distance detection module can detect the distance between the human body and the electronic device. When the distance between the human body and the electronic device is reduced to a certain range, the electronic device can reduce the power at which the antenna radiates to the outside, thereby reducing the intensity of electromagnetic waves and reducing influence on the human body.

SUMMARY

Provided in embodiments of the present disclosure are a human body distance detection module for an electronic device, an electronic device and a control method thereof. When the human body approaches the electronic device, the human body distance detection module can accurately detect change in the distance between the human body and the electronic device.

According to a first aspect of the present disclosure, a human body distance detection module for an electronic device, includes: a first metal sheet; a capacitance sensor electrically connected to the first metal sheet and configured to obtain a capacitance to ground of the first metal sheet, the capacitance to ground reflecting a distance between the human body and the electronic device; a second metal sheet, at least one part of the second metal sheet being disposed opposite to the first metal sheet, the second metal sheet and the first metal sheet being insulated from each other to enable mutual coupling, and the second metal sheet being not parallel to the first metal sheet.

According to a second aspect of the present disclosure, an electronic device includes the human body distance detection modules according to the first aspect.

According to a third aspect of the present disclosure, a controlling method for an electronic device according to the second aspect, includes: obtaining a capacitance to ground of the first metal sheet; when the capacitance to ground of the first metal sheet is higher than a preset threshold, the antenna of the electronic device operates at a first power; when the capacitance to ground of the first metal sheet is not higher than the preset threshold, the antenna of the electronic device operates at a second power which is greater than the first power.

The beneficial effects produced by the technical solutions provided in the embodiments of the present disclosure at least are the followings: by providing the first metal sheet and the second metal sheet and electrically connecting the first metal sheet to the capacitance sensor, when the human body approaches or moves away from any side of the first metal sheet, it can affect the capacitance to ground of the first metal sheet, and the capacitance to ground of the first metal sheet can reflect the distance between the human body and the electronic device. When the human body approaches the electronic device in a direction approximately parallel to the first metal sheet, as the second metal sheet is not parallel to the first metal sheet, as long as the direction is not parallel to the second metal sheet, there can be a large positive area between the second metal sheet and the human body, and the capacitance between the second metal sheet and the human body can change greatly, which causes a large change in the charge distribution on the second metal sheet. Further, because at least a part of the second metal sheet is arranged opposite to the first metal sheet, and the two sheets are insulated from each other to be able to couple with each other, when the human body approaches the electronic device in a direction approximately parallel to the first metal sheet as long as the direction is not parallel to the second metal sheet, the effect of the second metal sheet can still cause the capacitance to ground of the first metal sheet to change significantly, and the change in the distance between the human body and the electronic device can still be accurately reflected by the change in the capacitance to ground.

BRIEF DESCRIPTION OF THE DRAWINGS

The accompanying drawings, which are incorporated in and constitute a part of this specification, illustrate embodiments consistent with the present disclosure and, together with the description, serve lain the principles of the present disclosure.

DETAILED DESCRIPTION

Reference will now be made in detail to exemplary embodiments, examples of which are illustrated in the accompanying drawings. The following description refers to the accompanying drawings in which the same number in different drawings represents the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Figure 1:
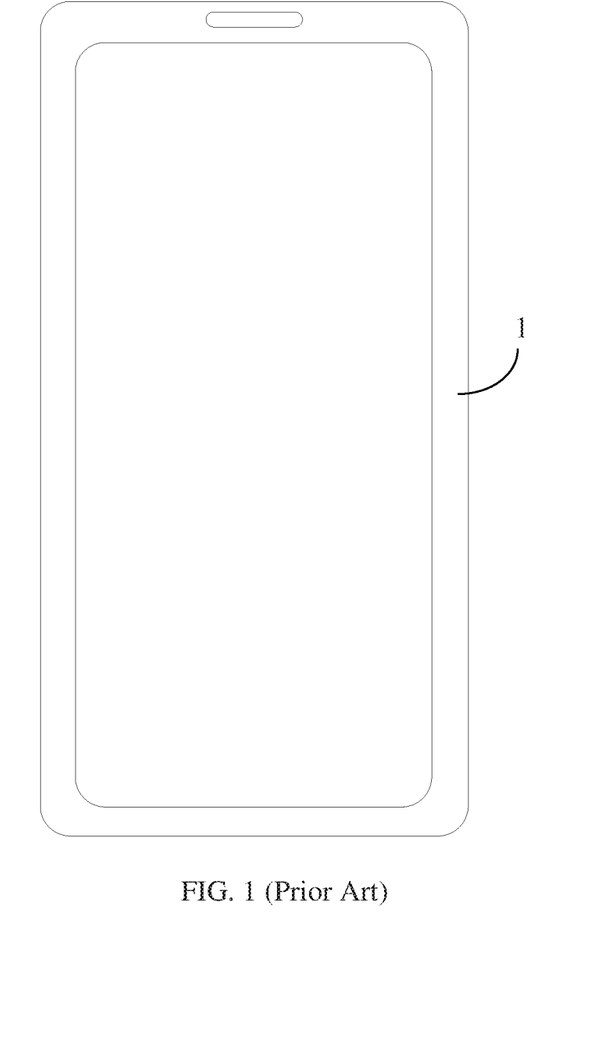
FIG. 1 is a schematic diagram of an external structure of an electronic device in related art.
Figure 2:
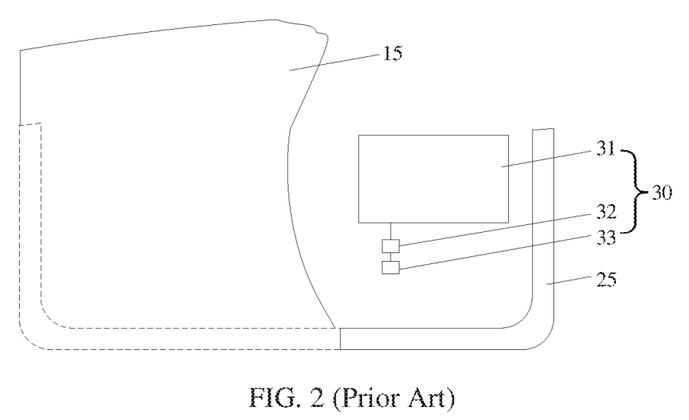
FIG. 2 is a schematic diagram of a partial structure of the electronic device shown in FIG. 1.

FIG. 1 is a schematic diagram of an external structure of an electronic device in related art. As shown in FIG. 1, the electronic device is a mobile phone 1 as an example. FIG. 2 is a schematic diagram of a partial structure of the electronic device shown in FIG. 1. As shown in FIG. 2, the mobile phone 1 includes a back cover 15 and a frame 25, and only parts of the back cover 15 and the frame 25 are shown in FIG. 2. The back cover 15 and the frame 25 are connected to each other to define an internal space of the mobile phone 1. A human body distance detection module 30 is disposed in the internal space.

As shown FIG. 2, the human body distance detection module 30 includes a metal sheet 31, a capacitance sensor 32, and a processor 33. The metal sheet 31 is electrically connected to the capacitance sensor 32, and the capacitance sensor 32 is electrically connected to the processor 33. Generally, the metal sheet 31 is parallel to the screen surface of the mobile phone. The side of the mobile phone from which its screen can be seen is defined as the front surface of the mobile phone, the surface opposite to the front surface is the back surface of the mobile phone (FIG. 2 shows the back surface of the mobile phone), and a surface connecting the front surface and back surface is the side surface. When the human body approaches the mobile phone toward the front surface or back surface of the mobile phone, the human body will affect the capacitance to ground of the metal sheet 3. The smaller the distance between the human body and the mobile phone is, the larger the capacitance to ground of the metal sheet 31 is, so that the distance between the human body and the mobile phone can be determined according to the capacitance to ground of the metal sheet 31. When the distance is less than a certain value, an antenna of the mobile phone can reduce the power of radiation to outside, reduce the intensity of the radiated electromagnetic waves, and avoid harm to the human body.

However, if the human body approaches the mobile phone toward the side surface of the mobile phone, since such a direction is approximately parallel to the metal sheet, the positive area between the metal sheet 31 and the human body is substantially 0. In this case, even if the human body approaches the mobile phone, the capacitance to ground of the metal sheet 31 will not be change significantly, so that the human body distance detection module 30 is less sensitive in this direction, the change in the distance between the human body and the mobile phone may not be accurately determined, thus the mobile phone may not adjust the power of the antenna in time to avoid influence human health. Further, with the advent of the fifth generation communication technology (5G), more and more antennas are disposed on the side surface of electronic device, which may aggravate the influence on human health.

Figure 3:
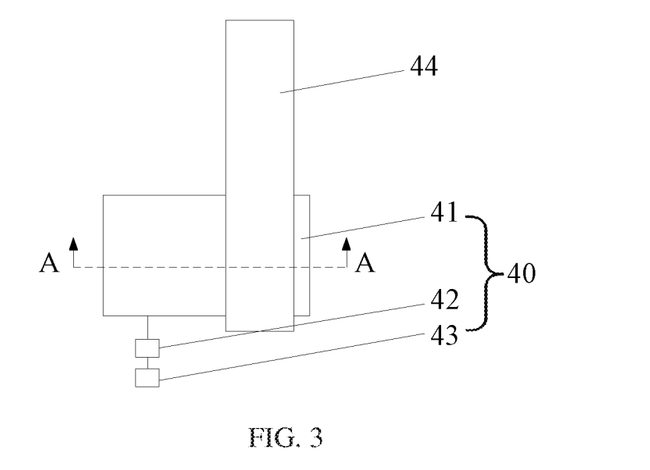
FIG. 3 is a schematic diagram of a human body distance detection module for an electronic device according to an embodiment of the present disclosure.

FIG. 3 is a schematic diagram of a human body distance detection module for an electronic device according to an embodiment of the present disclosure. As illustrated in FIG. 3, the human body distance detection module includes a first metal sheet 41, a capacitance sensor 42, and a second metal sheet 44. The capacitance sensor 42 is electrically connected to the first metal sheet 41. The capacitance sensor 42 is configured to obtain the capacitance to ground of the first metal sheet 41. The capacitance to the ground is configured to reflect a distance between the human body and the electronic device. At least part of the second metal sheet 44 is disposed opposite to the first metal sheet 41, and the second metal sheet 44 and the first metal sheet 41 are insulated from each other to enable mutual coupling.

In the embodiment of the present disclosure, when at least part of the second metal sheet 44 is disposed opposite to the first metal sheet 41, at least part of one among the two largest surfaces of the second metal sheet 44 is disposed opposite to the first metal sheet 41. When mutual coupling, distribution of charges on the second metal sheet 44 and distribution of charges on the first metal sheet 41 affect each other.

Figure 4:
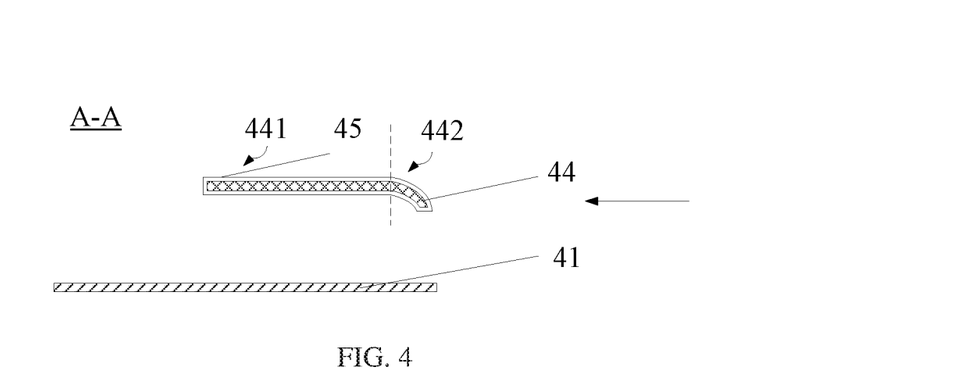
FIG. 4 is a cross-sectional diagram of a human body distance detection module for an electronic device according to an embodiment of the present disclosure.

FIG. 4 is a cross-sectional diagram of FIG. 3 taken along the line A-A. As illustrated in FIG. 4, at least part of the second metal sheet 44 is not parallel to the first metal sheet 41.

The part of the second metal sheet 44 which is not parallel to the first metal sheet 41 may or may not be disposed opposite to the first metal sheet 41. The cases that the part of the second metal sheet 44 which is not parallel to the first metal sheet 41 is disposed opposite to the first metal sheet 41 can include a case that the part is entirely disposed opposite to the first metal sheet 41, or a case that a partial region of the part is disposed opposite to the first metal sheet 41. The cases that the part of the second metal sheet 44 which is not parallel to the first metal sheet 41 is not disposed opposite to the first metal sheet 41 can include a case that the orthographic projection of part on the plane where the first metal sheet 41 is located does not overlap with the first sheet metal 41, or a case that the plane where the part is located is perpendicular to the plane where the first metal sheet 41 is located.

The cases that the second metal sheet 44 is at least partially non-parallel to the first metal sheet 41 can include a case that the second metal sheet 44 is a flat plate structure and the second metal sheet 44 is not parallel to the first metal sheet 41, or a case that the second metal sheet 44 is not a flat plate structure and at least a part region of the second metal sheet 44 is not parallel to the first metal sheet 41. FIG. 4 exemplarily illustrates an embodiment in which the second metal sheet 44 is not a flat plate structure, and the second metal sheet 44 in FIG. 4 has a part region which is not parallel to the first metal sheet 41.

By providing the first metal sheet and the second metal sheet and electrically connecting the first metal sheet to the capacitance sensor, when the human body approaches or moves away from any side of the first metal sheet, it can affect the capacitance to ground of the first metal sheet, and the capacitance to ground of the first metal sheet can reflect the distance between the human body and the electronic device. When the human body approaches the electronic device in a direction approximately parallel to the first metal sheet, since the second metal sheet is not parallel to the first metal sheet, as long as the direction is not parallel to the second metal sheet, there can be a large positive area between the second metal sheet and the human body, and the capacitance between the second metal sheet and the human body can change greatly, which causes a large change in distribution of charges on the second metal sheet. Further, because at least part of the second metal sheet is disposed opposite to the first metal sheet, and the two sheets are insulated from each other to be coupled with each other, when the human body approaches the electronic device in a direction approximately parallel to the first metal sheet, as long as the direction is not parallel to the second metal sheet, the effect of the second metal sheet can still cause the capacitance to ground of the first metal sheet to change significantly, and the change in the distance between the human body and the electronic device can still be accurately reflected by the change in the capacitance to ground.

The capacitance sensor 42 is a sensor capable of detecting a capacitance. For example, the capacitance sensor 42 may be a Specific Absorption Rate (SAR) sensor.

In an embodiment, shown in FIG. 3, the human body distance detection module can further include a processor 43. The processor 43 is electrically connected to the capacitance sensor 42, and the processor 43 is configured to determine the distance between the human body and the electronic device according to the capacitance to ground.

The positive are of the second metal sheet 44 and the first metal sheet 41 can be set according to requirements. The positive area of the second metal sheet 44 and the first metal sheet 41 can affect the sensitivity of the human body distance detection module. The larger the positive area of the second metal sheet 44 and the first metal sheet 41 is, the higher the sensitivity of the human body distance detection module 40 is.

In an embodiment, the first metal sheet 41 may be has a rectangular shape to facilitate production. The first metal sheet 41 can be made of a common metal or alloy, such as copper, silver, or an alloy thereof.

As illustrated in FIG. 4, the second metal sheet 44 can include a flat plate portion 441 and a bent portion 442 formed by bending at least one side edge of the flat plate portion 441 toward a side surface of the flat plate portion 441. An edge of the bent portion 442 is connected to an edge of the flat plate portion 441, and at least art of the flat plate portion 441 is disposed parallel and opposite to the first metal sheet 41. The flat plate portion 441 and the bent portion 442 are integrally formed. The flat plate portion 441 is disposed parallel and opposite to the first metal sheet 41, so that the first metal sheet 41 and the second metal sheet 44 can be better coupled to each other. The bent portion 442 is not parallel to the flat plate portion 441, and a large positive area can be formed between the bent portion 442 and the human body when the human body approaches the electronic device in a direction approximately parallel to the first metal sheet 41, so that the capacitance between the second metal sheet 44 and the human body can vary greatly. The positive area here may be an area of the orthographic projection of the second metal sheet 44 on a plane perpendicular to the direction in which the human body approaches. For example, if the human body approaches the electronic device along the horizontal arrow in FIG. 4, the positive area is the area of the orthographic projection of the second metal sheet 44 on a plane perpendicular to the direction of the arrow.

The second metal sheet 44 may be made of a common metal or alloy, such as copper, silver, or an alloy thereof.

The flat plate portion 441 may has a rectangular shape to facilitate production. The bent portion 442 can be connected to one side of the flat plate portion 441.

Figure 5:
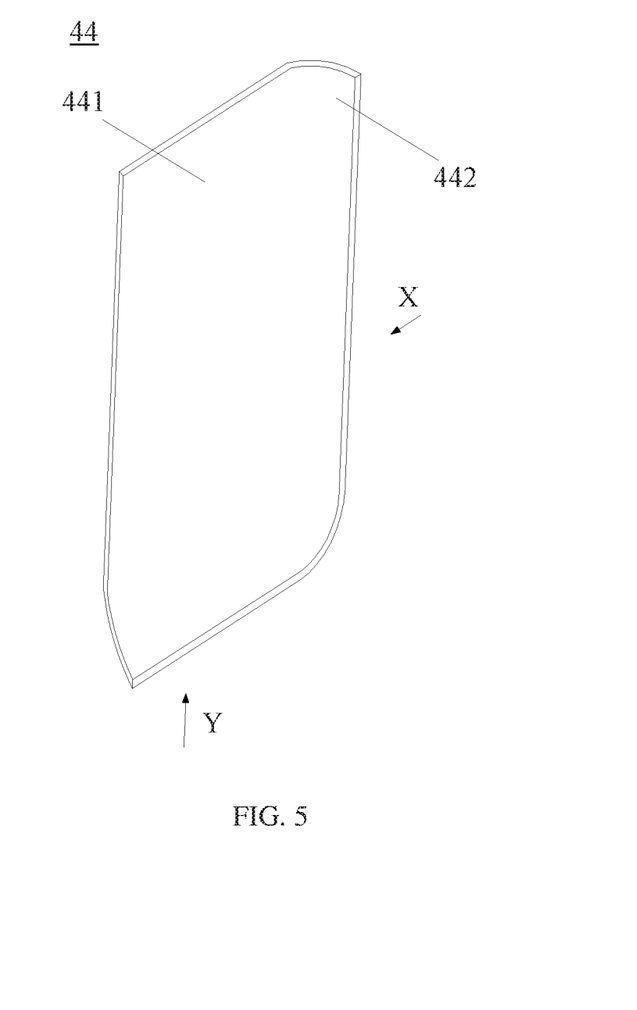
FIG. 5 is a schematic diagram of a partial structure of a metal sheet according to an embodiment of the present disclosure.

FIG. 5 is a schematic diagram of a partial structure of the second metal sheet according to an embodiment of the present disclosure. As illustrated in FIG. 5, two adjacent side edges of the flat plate portion 441 have bent portions 442, so that the distance between the human body and the electronic device can also be accurately determined when the human body approaches the electronic device in the direction (vertical to the X direction) in addition to the illustrated X direction. The two adjacent side edges of the bent portions 442 may or may not be connected to each other.

As an example, as illustrated in FIG. 4 and FIG. 5, the bent portion 442 can have an arc-plate shape. In an embodiment, the bent portion 442 can have a flat-plate shape. The shape of the bent portion 442 can be adapted to different electronic devices to facilitate the setting of the second metal sheet 44. As illustrated in FIG. 5, the bent portion 442 can be formed by bending a whole side edge of the flat plate portion 441 toward a side surface of the flat plate portion 441. In another embodiment, the bent portion 442 may further be formed by bending part of a side edge of the flat plate portion 441 toward a side surface of the flat plate portion 441.

In another embodiment, the second metal sheet 44 may have an arc-plate shape (referring to the shape of the bent portion 442 in FIG. 4 or FIG. 5). Since the second sheet metal 44 has an arc-plate shape, it is not parallel to the first metal sheet 41.

In an embodiment, shown in FIG. 4, the surface of the second metal sheet 44 may be covered with an insulating film 45. Due to the limited space inside the electronic device, it may be difficult to ensure that there is enough clearance between the second metal sheet 44 and other electronic components. By covering the surface of the second metal sheet 44 with the insulating film 45, the electrical contact between the second metal sheet 44 and other electronic components can be avoided.

As illustrated in FIG. 4, the insulating film 45 may be coated on the surface of the second metal sheet 44. All surfaces of the second metal sheet 44 are covered with the insulating film 45 to prevent the second metal sheet 44 from directly contacting other structures (for example, the first metal sheet 41 and the frame). In some embodiments, the insulating film 45 may cover only a part of the surface of the second metal sheet 44, for example, the insulating film 45 only covers the surface of the second metal sheet 44 on its side near the first metal sheet 41. The covering position of the insulating film 45 may be set according to arrangements of other electronic components inside the electronic device that may be in contact with the second metal sheet 44 to separate the second metal sheet 44 from these electronic components.

Figure 6:
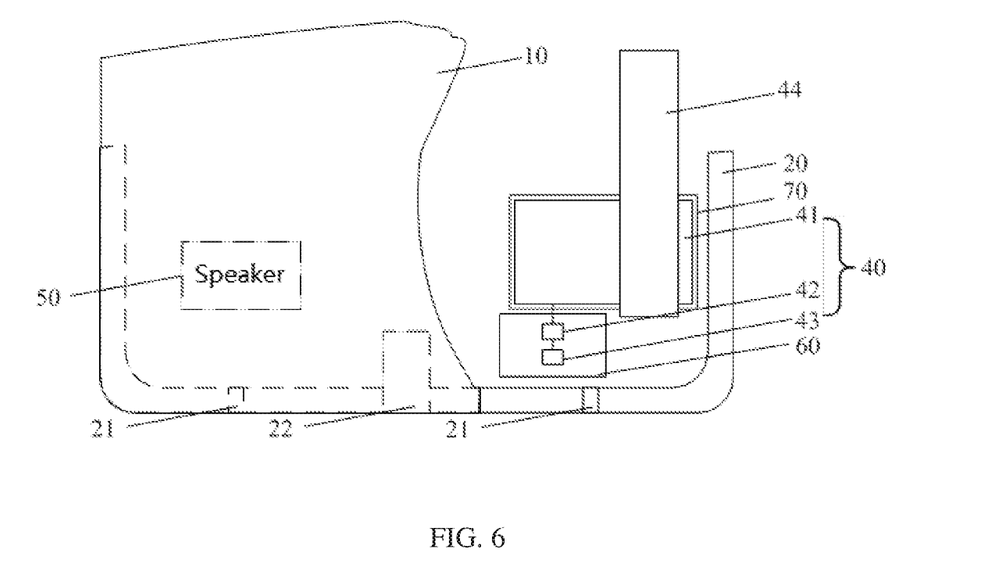
FIG. 6 is a schematic diagram of a partial structure of an electronic device according to an embodiment of the present disclosure.

FIG. 6 is a schematic diagram of a partial structure of an electronic device according to an embodiment of the present disclosure. As illustrated in FIG. 6, the electronic device includes a human body distance detection module 40 as illustrated in FIG. 3. The electronic device can be, but is not limited to, a mobile phone or a tablet computer.

As illustrated in FIG. 6, the electronic device may include a back cover 10 and a frame 20, and only parts of the back cover 10 and the frame 20 are illustrated in FIG. 6. The back cover 10 and the frame 20 are connected to each other to define an internal space of the electronic device, and the human body distance detection module 40 is disposed in the internal space. The internal space can accommodate various components including the human body distance detection module 40. In addition, the internal space can further be configured to accommodate other components of the electronic device, such as a speaker 50, a microphone, and the like. For different electronic devices, the relative positional relationship between components such as the speaker 50, the microphone, and the human body distance detection module 40 may be different. For example, as illustrated in FIG. 6, the speaker 50 and the human body distance detection module 40 may both be located at corners of the frame 20 to prevent the speaker 50 and the human body distance detection module 40 from occupying the mounting space of the display screen of the electronic device.

The frame 20 can be configured as an antenna for the electronic device. As illustrated in FIG. 6, the frame 20 is provided with an antenna partition bar 21. The frame 20 is made of metal, and the antenna partition bar 21 is made of an insulator. For example, the antenna partition bar 21 can be made of plastic. In this way, the frame 20 is divided into discrete sections by the antenna partition bar 21, and each section can serve as an antenna.

The frame 20 can further have an interface 22. The interface 22 may include a Universal Serial Bus (USB) interface a headphone jack, a charging interface and the like. For example, the interface 22 may be located between the speaker 50 and the human body distance detection module 40.

The internal space may further be provided with a Printed Circuit Board (PCB) 60, the capacitance sensor 42 and the processor 43 can be provided on the PCB 60.

In an embodiment, a bracket 70 may be further provided in the internal space, and the first metal sheet 41 may be located on the bracket 70. The bracket 70 is provided to facilitate the arrangement of the first metal sheet 41.

In an embodiment, the electronic device is provided with a variety of antennas, and some of the antennas may be provided in the internal space through an antenna bracket. For example, the antenna bracket is fixedly installed at a corner of the internal space, and the antenna is fixed on the surface of the antenna bracket. The bracket 70 here may be an antenna bracket. By using the existing antenna bracket to arrange the first metal sheet 41, the occupied space can be reduced. If there is no antenna bracket inside the electronic device, or the location of the antenna bracket is not convenient for the arrangement of the human body distance detection module 40, a further bracket 70 may be provided in the electronic device.

In an embodiment, the first metal sheet 41 may be fixed on the bracket 70 by an adhesive or a fixing element such as a screw.

In an embodiment, the first metal sheet 41 may also be formed on the bracket 70 by using a Laser-Direct-Structuring (LDS) technology. The LDS has high manufacturing precision, which is convenient for accurately controlling the shape and size of the first metal sheet 41.

The second metal sheet 44 may be located on the back cover 10. The second metal sheet 44 may be conveniently arranged, as long as the second metal sheet 44 is arranged in a suitable position so that at least a partial region of the second metal sheet 44 is opposite to the first metal sheet 41 upon the connection between the back cover 10 and the frame 20. In addition, since the second metal sheet 44 is provided on the back cover 10, and other structures of the electronic device may not need to be changed, the manufacturing process is changed little, the cost is low, and it is easy to implement.

In an embodiment, the second metal sheet 44 may be fixed to the surface of the back cover 10 by an adhesive or a fixing element such as a screw.

When the second metal sheet 44 is located on the surface of the back cover 10, since the surface of the side of the second metal sheet 44 away from the first sheet metal 41 abuts the back cover 10, while the back cover 10 is usually made of an insulating material, the insulating film 45 on the surface of the second metal sheet 44 may only cover the surface of the side of the second metal sheet 44 near the first metal sheet 41.

Figure 7:
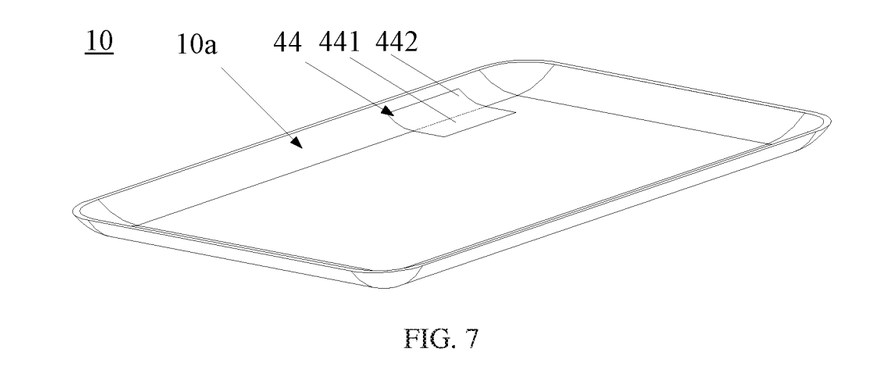
FIG. 7 is a schematic diagram of a back cover according to an embodiment of the present disclosure.

FIG. 7 is a schematic diagram of the back cover 10 provided by an embodiment of the present disclosure. As illustrated in FIG. 7, the surface of the back cover 10 facing the human body distance detection module 40 has an edge region 10a that is not parallel to the first metal sheet 41. The surface of the back cover 10 is not entirely flat. Generally, the middle part of the back cover 10 of the electronic device is flat and the edges thereof have a certain arc shape, and the edges are not coplanar with the middle part. By adopting the back cover 10 with this shape, the electronic device can fit the user's palm better when being held by the user, which is convenient for holding.

As illustrated in FIG. 7, at least part of the second metal sheet 44 may be formed in the above-mentioned edge region 10a, Since at least part of the second metal sheet 44 is formed in the edge region 10a, a part of the second metal sheet 44 can be bent to form a bent portion 442 by using the surface of the back cover 10, and the unbent portion of the second metal sheet 44 forms the flat plate portion 441. The second metal sheet 44 is arranged at the edge of the back cover 10, so that the bent portion 442 may have a larger area. The bent portion 442 having a larger area helps to improve the sensitivity of the human body distance detection module 40.

When the human body distance detection module 40 includes the second metal sheet 44 as illustrated in FIG. 5, the second metal sheet 44 may be disposed at a corner of the back cover 10.

In an embodiment, the second metal sheet 44 may further be formed on the back cover 10 through LDS. With the continuous development of technology, the number of various sensors installed in an electronic device is increasing, and the number of antennas is also increasing. For example, with the advent of 5G, mobile phones may need to add antennas that support 5G, thus the interior of an electronic device becomes more and more crowded, and various components thereof are more and more subject to constraints on space. Forming the second metal sheet 44 on the back cover 10 through LDS can greatly reduce the space occupied by the second metal sheet 44 without affecting normal installation of other components. And the second metal sheet 44 formed through LDS will extend along the surface of the back cover 10, so that the surface shape of the back cover 10 can be directly used to form the second metal sheet 44 a part region of which is bent, to cause the second metal sheet 44 and the first metal sheets 41 to be unparallel. Exemplarily, through LDS process, a conductive silver paste can be formed on the surface of the back cover 10 to directly make the second metal sheet 44 on the back cover 10.

Figure 8:
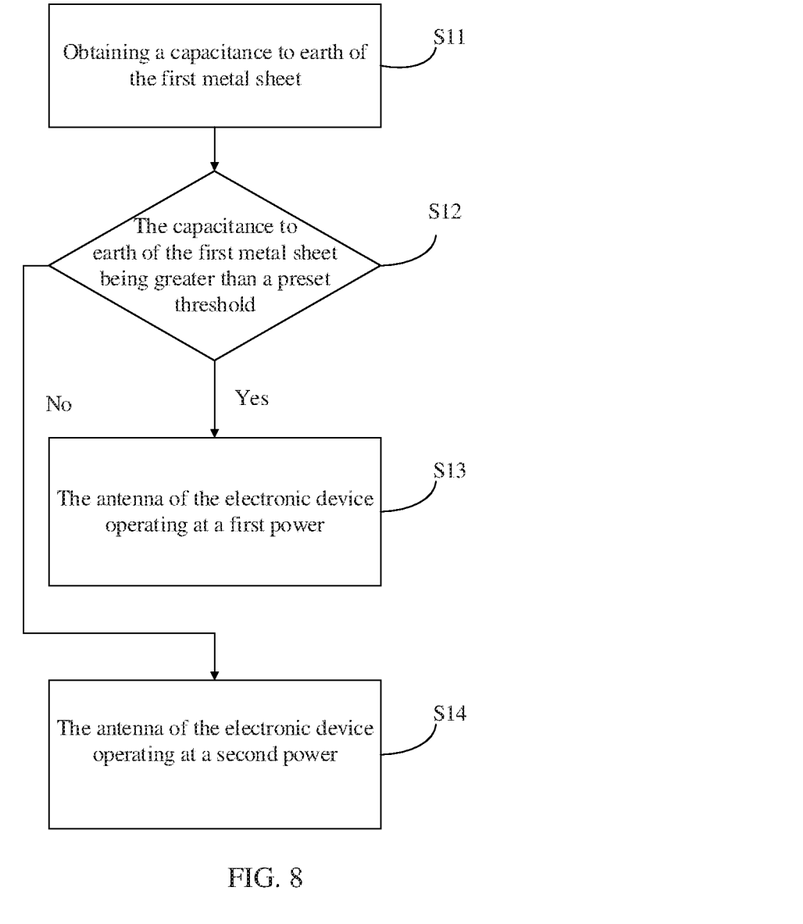
FIG. 8 is a flowchart of a control method for an electronic device according to an embodiment of the present disclosure.

FIG. 8 is a flowchart of a control method for an electronic device according to an embodiment of the present disclosure. For example, the electronic device may be any of the above described electronic devices. As illustrated in FIG. 8, the method includes the following steps.

In step S11, a capacitance to ground of the first metal sheet is obtained.

In step S12, the capacitance to ground of the first metal sheet is compared with a preset threshold.

If the capacitance to ground of the first metal sheet is higher than the preset threshold, step S13 is performed; and if the capacitance to ground of the first metal sheet is not higher than the preset threshold, step S14 is performed.

In step S13, the antenna of the electronic device operates at a first power.

In step S14, the antenna of the electronic device operates at a second power.

The second power is greater than the first power.

The capacitance to ground of the first metal sheet reflects the distance between the human body and the electronic device. The capacitance to ground is inversely related to the distance, that is, the closer the human body is to the electronic device, the greater the capacitance to ground of the first metal sheet is. A capacitance to ground of the first metal sheet, determined through testing when the distance between the human body and the electronic device is a safe distance, can be set as the preset threshold. The safe distance here may be the minimum allowable distance between the human body and the electronic device when the antenna of the electronic device operates at the second power in the relevant industry or enterprise.

When the capacitance to ground of the first metal sheet is higher than the preset threshold, it can be obtained according to the relationship between the capacitance to ground and the distance that, the distance between the human body and the electronic device is small at this time, so operating the antenna of the electronic device at a first power which is relatively low can prevent the radiation power of the antenna from being too large and adversely affecting the human body. When the capacitance to ground of the first metal sheet is not higher than the preset threshold, it can be obtained according to the relationship between the capacitance to ground and the distance that, the distance between the human body and the electronic device is relatively large at this time, so operating the antenna of the electronic device at a second power which is relatively high can make the antenna to work more efficiently and ensure normal communication. By adjusting the radiation power of the antenna of the electronic device according to the change in the distance between the human body and the mobile phone, the harmful effects of radiation on the human body can be avoided and normal communication can be ensured.

Other embodiments of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are to be considered as exemplary only, with a true scope and spirit of the present disclosure is indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

The invention claimed is:

1. A human body distance detection module for an electronic device, the human body distance detection module being disposed in an internal space of the electronic device and comprising:
   a first metal sheet;
   a capacitance sensor electrically connected to the first metal sheet and configured to obtain a capacitance to ground of the first metal sheet, the capacitance to ground configured to reflect a distance between a human body and the electronic device; and
   a second metal sheet, at least one part of the second metal sheet being disposed to be opposite to the first metal sheet, the second metal sheet and the first metal sheet being insulated from each other to enable mutual coupling, and at least one part of the second metal sheet being not parallel to the first metal sheet,
   wherein the second metal sheet comprises a flat plate portion and a bent portion formed by bending at least one side edge of the flat plate portion toward a side surface of the flat plate portion, at least one part of the flat plate portion being disposed to be opposite to and in parallel with the first metal sheet, the flat plate portion has a rectangular shape, and two adjacent side edges of the flat plate portion have the bent portion.

2. The human body distance detection module according to claim 1, wherein the bent portion has one of a flat plate shape or an arc plate shape.

3. The human body distance detection module according to claim 1, wherein a part of the second metal sheet which is not parallel to the first metal sheet is disposed to be opposite to the first metal sheet.

4. The human body distance detection module according to claim 3, wherein the part of the second metal sheet which is not parallel to the first metal sheet is entirely disposed to be opposite to the first metal sheet.

5. The human body distance detection module according to claim 3, wherein a partial region of the part of the second metal sheet which is not parallel to the first metal sheet is disposed to be opposite to the first metal sheet.

6. The human body distance detection module according to claim 1, wherein a surface of the second metal sheet is coated with an insulating film.

7. The human body distance detection module according to claim 1, wherein at least part of one of two largest surfaces of the second metal sheet is disposed to be opposite to the first metal sheet.

8. The human body distance detection module according to claim 1, wherein a part of the second metal sheet which is not parallel to the first metal sheet is not disposed to be opposite to the first metal sheet.

9. The human body distance detection module according to claim 8, wherein an orthographic projection of the part of the second metal sheet which is not parallel to the first metal sheet onto a plane where the first metal sheet is located does not overlap with the first sheet metal.

10. The human body distance detection module according to claim 8, wherein a plane where the part of the second metal sheet which is not parallel to the first metal sheet is located is perpendicular to a plane where the first metal sheet is located.

11. An electronic device, comprising a human body distance detection module disposed in an internal space of the electronic device, the human body distance detection module comprising:
   a first metal sheet;
   a capacitance sensor electrically connected to the first metal sheet and configured to obtain a capacitance to ground of the first metal sheet, the capacitance to ground configured to reflect a distance between a human body and the electronic device; and
   a second metal sheet, at least one part of the second metal sheet being disposed to be opposite to the first metal sheet, the second metal sheet and the first metal sheet being insulated from each other to enable mutual coupling, and at least one part of the second metal sheet being not parallel to the first metal sheet, wherein the second metal sheet comprises a flat plate portion and a bent portion formed by bending at least one side edge of the flat plate portion toward a side surface of the flat plate portion, at least one part of the flat plate portion being disposed to be opposite to and in parallel with the first metal sheet, the flat plate portion has a rectangular shape, and two adjacent side edges of the flat plate portion have the bent portion.

12. The electronic device according to claim 11, wherein the electronic device comprises a back cover and a frame connected to each other, and the internal space of the electronic device is defined by the back cover and the frame, and the second metal sheet is disposed on the back cover.

13. The electronic device according to claim 12, wherein the second metal sheet is formed on the back cover through a laser direct structuring technique.

14. The electronic device according to claim 12, wherein a surface of the back cover facing the human body distance detection module has an edge region that is not parallel to the first metal sheet, and at least one part of the second metal sheet is formed in the edge region.

15. The electronic device according to claim 12, wherein a bracket is provided in the internal space, and the first metal sheet is disposed on the bracket.

16. The electronic device according to claim 11, wherein the bent portion has one of a flat plate shape or an arc plate shape.

17. The electronic device according to claim 11, wherein a part of the second metal sheet which is not parallel to the first metal sheet is disposed to be opposite to the first metal sheet, or a part of the second metal sheet which is not parallel to the first metal sheet is not disposed to be opposite to the first metal sheet.

18. The electronic device according to claim 11, wherein a surface of the second metal sheet is coated with an insulating film.

19. A method for controlling an electronic device, wherein the electronic device is the electronic device according to claim 11, the method comprising:

obtaining a capacitance to ground of the first metal sheet;

when the capacitance to ground of the first metal sheet is higher than a preset threshold, an antenna of the electronic device operates at a first power; and     when the capacitance to ground of the first metal sheet is not higher than the preset threshold, the antenna of the electronic device operates at a second power which is greater than the first power.

\* \* \* \* \*